United States Patent
Lai et al.

(10) Patent No.: US 6,595,841 B2
(45) Date of Patent: Jul. 22, 2003

(54) APPARATUS FOR HOLDING WAFER CASSETTES IN A CASSETTE TUB DURING A CHEMICAL MECHANICAL POLISHING PROCESS

(75) Inventors: Kevin Lai, Taichung (TW); Yao-Hsiang Liang, Kaohsiang (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 9 days.

(21) Appl. No.: 10/029,466

(22) Filed: Dec. 20, 2001

(65) Prior Publication Data

US 2003/0119434 A1 Jun. 26, 2003

(51) Int. Cl.$^7$ ................................ B24B 41/06
(52) U.S. Cl. ................. 451/364; 414/940; 269/903; 248/694
(58) Field of Search ............... 414/935–940; 269/903, 126, 71, 58; 248/694; 451/364

(56) References Cited

U.S. PATENT DOCUMENTS

| | | | | |
|---|---|---|---|---|
| 5,507,614 A | * | 4/1996 | Leonov et al. | 414/768 |
| 6,152,680 A | * | 11/2000 | Howells et al. | 414/782 |
| 6,352,399 B1 | * | 3/2002 | Martin et al. | 414/156 |
| 6,354,794 B2 | * | 3/2002 | Sato et al. | 414/811 |
| 6,454,327 B1 | * | 9/2002 | Chang | 294/1.1 |

* cited by examiner

Primary Examiner—George Nguyen
(74) Attorney, Agent, or Firm—Tung & Associates

(57) ABSTRACT

A cassette tub for holding at least one wafer cassette in a tilted position for accessing by a robot blade by utilizing a cassette tub pin assembly to ensure the tilt angle of the wafer cassette is described. The cassette tub is filled with water such that wafers during a chemical mechanical polishing process may be stored therein without any residual slurry solution solidified on the surface of the wafer, and thus eliminating the generation of any contaminating particles or abrasive particles which may cause severe scratching in a subsequent chemical mechanical polishing process. The cassette tub pin assembly is securely mounted to a mounting reel in the cassette tub such that the angle of the wafer cassette is ensured.

10 Claims, 2 Drawing Sheets

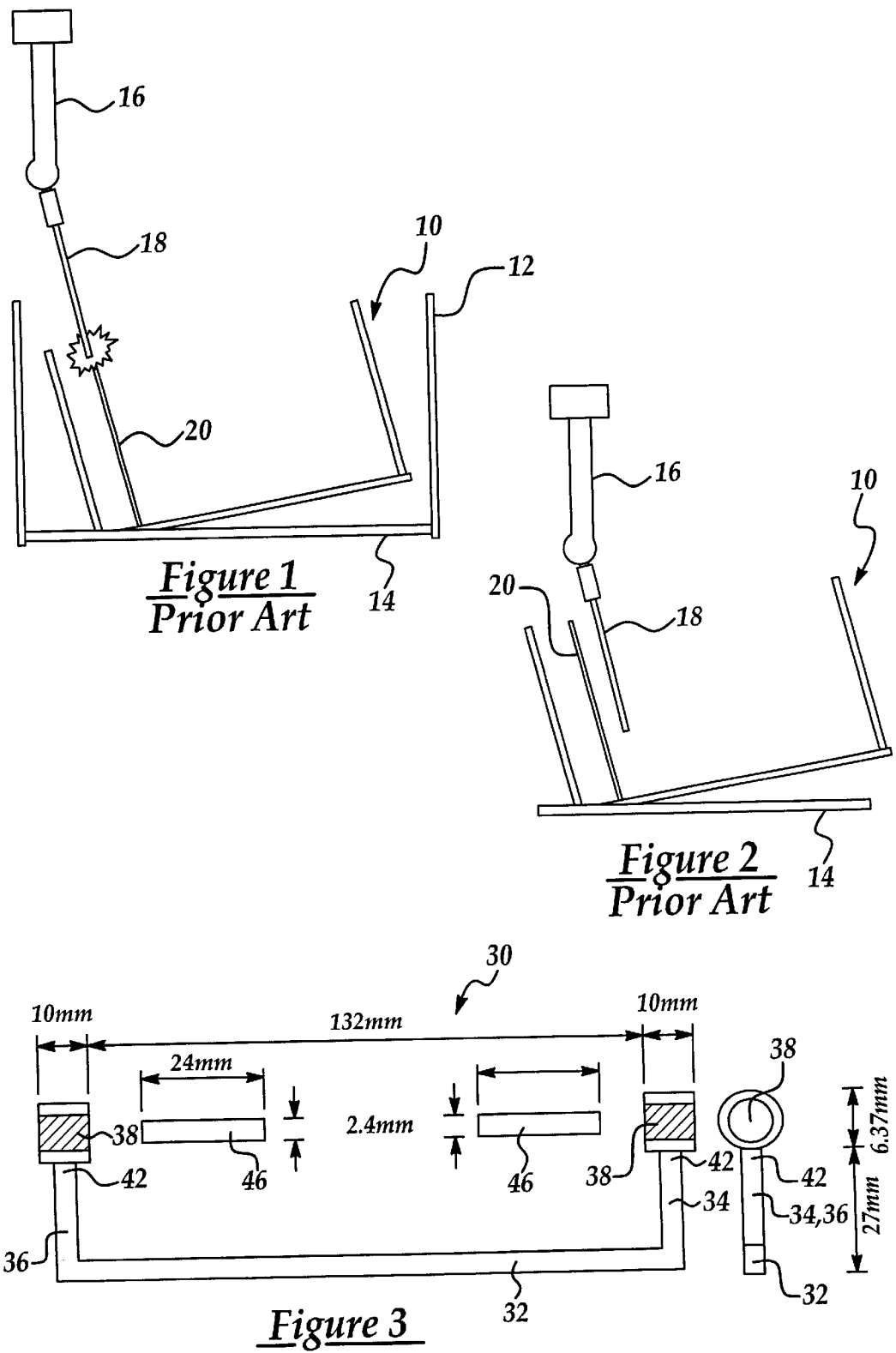

APPARATUS FOR HOLDING WAFER CASSETTES IN A CASSETTE TUB DURING A CHEMICAL MECHANICAL POLISHING PROCESS

FIELD OF THE INVENTION

The present invention generally relates to an apparatus for holding wafer cassettes in a cassette tub during a chemical mechanical polishing (CMP) process and more particularly, relates to a cassette tub for holding at least one wafer cassette in a tilted position for accessing by a robot blade equipped with at least one cassette tub pin assembly.

BACKGROUND OF THE INVENTION

Apparatus for polishing thin, flat semi-conductor wafers is well not in the art. Such apparatus normally includes a polishing head which carries a membrane for engaging and forcing a semi-conductor wafer against a wetted polishing surface, such as a polishing pad. Either the pad, or the polishing head is rotated and oscillates the wafer over the polishing surface. The polishing head is forced downwardly onto the polishing surface by a pressurized air system or, similar arrangement. The downward force pressing the polishing head against the polishing surface can be adjusted as desired. The polishing head is typically mounted on an elongated pivoting carrier arm, which can move the pressure head between several operative positions. In one operative position, the carrier arm positions a wafer mounted on the pressure head in contact with the polishing pad. In order to remove the wafer from contact with the polishing surface, the carrier arm is first pivoted upwardly to lift the pressure head and wafer from the polishing surface. The carrier arm is then pivoted laterally to move the pressure head and wafer carried by the pressure head to an auxiliary wafer processing station. The auxiliary processing station may include, for example, a station for cleaning the wafer and/or polishing head; a wafer unload station; or, a wafer load station.

More recently, chemical-mechanical polishing (CMP) apparatus has been employed in combination with a pneumatically actuated polishing head. CMP apparatus is used primarily for polishing the front face or device side of a semiconductor wafer during the fabrication of semiconductor devices on the wafer. A wafer is "planarized" or smoothed one or more times during a fabrication process in order for the top surface of the wafer to be as flat as possible. A wafer is polished by being placed on a carrier and pressed face down onto a polishing pad covered with a slurry of colloidal silica or alumina in de-ionized water.

The CMP method can be used to provide a planner surface on dielectric layers, on deep and shallow trenches that are filled with polysilicon or oxide, and on various metal films. A possible mechanism for the CMP process involves the formation of a chemically altered layer at the surface of the material being polished. The layer is mechanically removed from the underlying bulk material. An outer layer is then regrown on the surface while the process is repeated again. For instance, in metal polishing, a metal oxide layer can be formed and removed repeatedly.

During a CMP process, a large volume of a slurry composition is dispensed. The slurry composition and the pressure applied between the wafer surface and the polishing pad determine the rate of polishing or material removal from the wafer surface. The chemistry of the slurry composition plays an important role in the polishing rate of the CMP process. For instance, when polishing oxide films, the rate of removal is twice as fast in a slurry that has a pH of 11 than with a slurry that has a pH of 7. The hardness of the polishing particles contained in the slurry composition should be about the same as the hardness of the film to be removed to avoid damaging the film. A slurry composition typically consists of an abrasive component, i.e, hard particles and components that chemically react with the surface of the substrate. For instance, a typical oxide polishing slurry composition consists of a colloidal suspension of oxide particles with an average size of 30 nm suspended in an alkali solution at a pH larger than 10. A polishing rate of about 120 nm/min can be achieved by using this slurry composition. Other abrasive components such as ceria suspensions may also be used for glass polishing where large amounts of silicon oxide must be removed. Ceria suspensions act as both the mechanical and the chemical agent in the slurry for achieving high polishing rates, i.e, larger than 500 nm/min. While ceria particles in the slurry composition remove silicon oxide at a higher rate than do silica, silica is still preferred because smoother surfaces can be produced. Other abrasive components, such as alumina ($Al_2O_3$) may also be used in the slurry composition.

When a wafer surface is planarized by a CMP process, the wafer may have to be transferred between various CMP process stations before the planarization is completed. During the transfer of the wafer between various CMP stations, the wafers are stored in a wafer storage cassette in a vertical position and the whole cassette is positioned in a water tank such that the wafers are immersed in water to prevent the slurry solution left on the wafer surface from drying or solidifying. This is an important process step since if the wafers are not stored immersed in water, the solidified particles on the wafer surface becomes a major contamination source and cause serious scratches on the wafer surface during a subsequent CMP operation.

A cassette tub is normally used for holding at least one wafer cassette, i.e. for holding four wafer cassettes, in a tilted position for accessing by a robot blade, as shown in FIGS. 1 and 2. A wafer cassette 10 is positioned in a cassette tub 12 at a tilt angle of about 5.5° as measured from the horizontal plane, i.e. from the bottom wall 14 of the tub. A robot 16 that operates a robot blade 18 is used to pick-up wafers 20 that are stored in the wafer cassette 10. The wafers 20 are positioned in slots (not shown) formed on the interior sidewall of the wafer cassette 10. For instance, the robot blade 18, shown in FIG. 2, is in a pickup position when the robot lowers the blade.

In a conventional chemical mechanical polishing apparatus, a cassette tub pin is used to fix the wafer cassette positioned inside the tub. In the original design provided by the machine manufacturer, only one single pin is used for inserting into a cassette tub hole. The single pin is supposed to hold the wafer cassette in position during the step when the robot picks up a wafer from the cassette. However, the single cassette tub pin can easily fall off the cassette tub hole and thus causing the cassette position to shift away from its supposed position, i.e. at a 5.5° angle. When the shifting occurs, the robot blade 18, when lowered to pick up a wafer as shown in FIG. 1, may collide with the wafer 20 and thus either causing a wafer breakage or a serious scratch on the wafer. It is therefore an important step in the robot blade pick-up process that a wafer cassette must be positioned precisely at its supposed angle inside the tub for preventing damages to wafers.

It is therefore an object of the present invention to provide a cassette tub for holding at least one wafer cassette in a tilted position for accessing by a robot blade that does not have the drawbacks or shortcomings of the conventional apparatus.

It is another object of the present invention to provide a cassette tub for holding at least one wafer cassette in a tilted position for accessing by a robot blade wherein the wafer cassette is immersed in water.

It is a further object of the present invention to provide a cassette tub for holding at least one wafer cassette in a tilted position for accessing by a robot blade wherein the at least one wafer cassette is held at an angle between about 3° and about 7° when measured from a horizontal plane.

It is another further object of the present invention to provide a cassette tub for holding at least one wafer cassette in a tilted position for accessing by a robot blade wherein at least one cassette tub pin assembly is used for fixing the position of the at least one wafer cassette.

It is still another object of the present invention to provide a cassette tub for holding at least one wafer cassette in a tilted position for accessing by a robot blade wherein at least one cassette tub pin assembly is utilized for engaging a planar base portion of a wafer cassette.

It is yet another object of the present invention to provide a cassette tub for holding at least one wafer cassette in a tilted position for accessing by a robot blade wherein at least one cassette tub pin assembly is used to fix the position of the at least one wafer cassette by attaching to two mounting rails by screws.

SUMMARY OF THE INVENTION

In accordance with the present invention, a cassette tub for holding at least one wafer cassette in a tilted position for accessing by a robot blade is disclosed.

In a preferred embodiment, a cassette tub for holding at least one wafer cassette in a tilted position for accessing by a robot blade is provided which includes a tub body of generally rectangular shape with an open top for holding a quantity of water therein, the tub body has two opposing longitudinal sidewalls; a support structure affixed to a process machine onto which the tub body is situated equipped with two mounting rails along the longitudinal sidewalls each having mounting holes for receiving at least one cassette tub pin assembly; at least one wafer cassette that has a planar base portion for engaging the at least one cassette tub pin assembly such that the at least one wafer cassette is maintained at a tilted position of between about 3° and about 7° when measured from a horizontal plane; and at least one cassette tub pin assembly each having a straight section for engaging the planar base portion of a wafer cassette and two 90° bent sections each with a screw hole at a tip portion, each screw hole for engaging one of the mounting holes provided in one of the mounting rails by a screw.

In the cassette tub for holding at least one wafer cassette in a tilted position for accessing by a robot blade, the at least one cassette tub pin assembly is fabricated of stainless steel, while the tub body is fabricated of a chemical resistant, non-particle generating material, or the tub body is fabricated of teflon. The support structure may be fabricated of stainless steel. The planar base portion may be equipped with engagement means for engaging the cassette tub pin assembly, or the planar base portion may be equipped with a recessed slot for engaging the cassette tub pin assembly. The tub may hold four wafer cassettes. The two mounting rails on the support structure may be fabricated of teflon. The screw used to engage the screw hole on the cassette tub pin assembly to the mounting hole on the mounting rail may be fabricated of stainless steel.

BRIEF DESCRIPTION OF THE DRAWINGS

These and other objects, features and advantages of the present invention will become apparent from the following detailed description and the appended drawings in which:

FIG. 1 is a cross-sectional view of a conventional cassette tub with a wafer cassette mounted therein illustrating a robot blade colliding with a wafer.

FIG. 2 is a cross-sectional view of a conventional cassette tub having a wafer cassette situated therein and a robot blade picking-up a cassette wherein the cassette is situated at 5.5° from the horizontal plane.

FIG. 3 is a cross-sectional view and an end view of the present invention cassette tub pin assembly.

DETAILED DESCRIPTION OF THE PREFERRED EMBODIMENT

Figure 4:
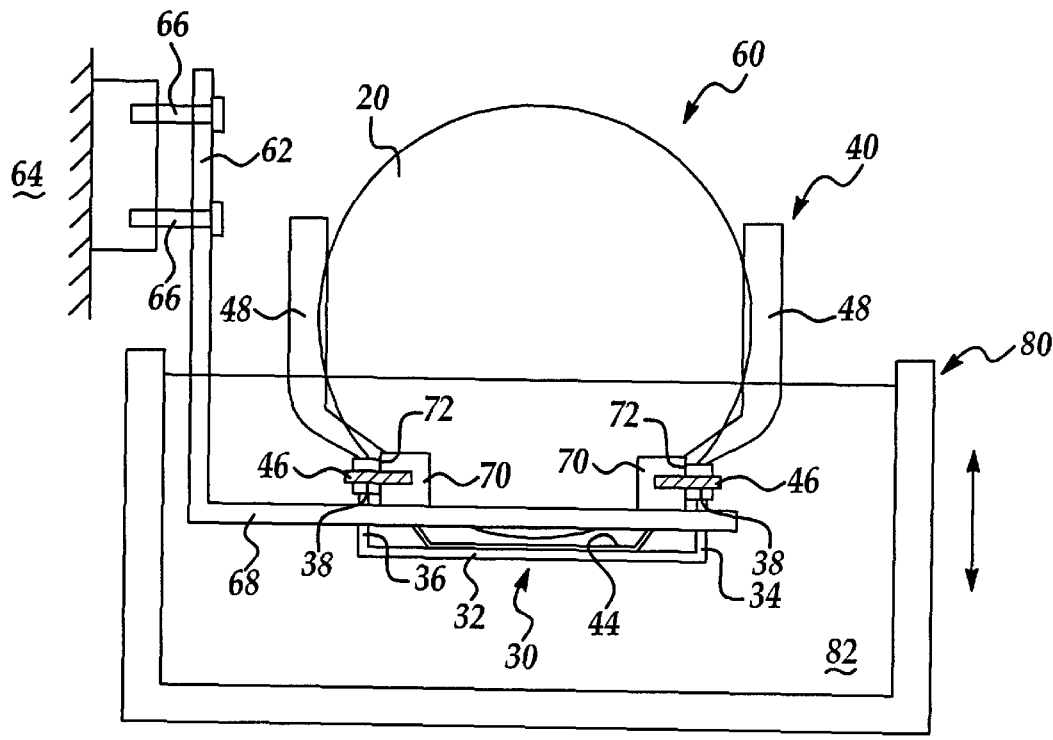
FIG. 4 is a cross-sectional view of the present invention cassette tub for holding at least one wafer cassette in a tilted position for accessing by a robot blade without damaging the wafer.

The present invention discloses a cassette tub for holding at least one wafer cassette in a tilted position for accessing by a robot blade when the cassette tub is filled with water. The water in the cassette tub prevents any residual slurry solution on top of the wafers from drying or solidifying and thus, eliminating the generation of contaminating particles or abrasive particles which may cause serious scratches on the wafer surface during a subsequent chemical mechanical polishing process.

The present invention cassette tub is equipped with at least one novel cassette tub pin assembly which is formed of a straight section for engaging the planar base portion of a wafer cassette and keeping the cassette at a preselected tilt angle, and two 90° bent sections each having a screw hole at a tip portion wherein each screw hole engages one of the mounting holes provided in one of the mounting rails situated on a support structure by a screw. The support structure is affixed to the process machine onto which the cassette tub is positioned. The cassette tub may be moved up or down by a motorized mounting means and is filled with water such that, when the cassette tub is moved to a downward position, the wafer cassettes can be easily accessed by a machine operator. The wafer cassettes are normally positioned at a tilt angle of between about 3° and about 7°, and preferably between about 4° and about 6° when measured from a horizontal plane for accessing by a robot blade for picking-up individual wafers.

When compared to the conventional tub pin assembly of a single pin, the present invention tub pin assembly is fastened to a mounting rail for supporting a wafer cassette by two screws such that the chances of the tub pin assembly falling off the mounting rail is eliminated.

The present invention cassette tilt angle is used in a computer for two calculations in the wafer pick-up process. First, when the robot blade moves vertically in the Z-direction to pick-up a wafer, it also moves horizontally in the X-direction. The cassette tilt angle is used by the computer to calculate how far the blade is to move in the X-direction. Secondly, the cassette tilt is used in conjunction with the pitch, to calculate where the other wafers (other than the first wafer) are located. The present invention novel cassette tub pin assembly ensures the positioning of the pins on the mounting rail such that all the wafer cassettes have the same tilt angle between about 3° and about 7°, and preferably between about 4° and about 6°.

Referring now to FIG. 3, wherein a cross-sectional view of a present invention cassette tub pin assembly 30 is shown. The cassette pin assembly 30 is constructed by an elongated, straight section 32 for engaging the planar base portion 44 (shown in FIG. 4) of a wafer cassette 40, and two 90° bent sections 34,36 each having a screw hole 38 at a tip portion 42. The screw hole 38 is used for engaging one of the mounting holes 52 provided in one of the mounting rails 50 (see FIG. 5) by a screw 46. The cassette tub pin assembly may be suitably fabricated of a stainless steel material such that no corrosion can occur after prolonged immersion in water. Internal threads are provided in the mounting hole 38 to match the external threads on the screws 46. The screws 46 are fabricated of stainless steel material to prevent corrosion.

Referring now to FIG. 4, wherein a cross-sectional view of the present invention cassette tub assembly 60 is shown. The cassette tub assembly consists of a support structure 62 that is affixed to the process machine 64 by mounting means, such as screws 66. On a horizontal portion 68 of the support structure 62, is mounted two longitudinal rails 70 fabricated of a chemical resistant, non-particle generating material such as teflon. On the outside surface 72 of the teflon rails 70, is provided screw holes for engaging screws 46 of the cassette tub pin assembly 30 through the screw holes 38. As shown in FIG. 4, a wafer cassette 40 which has a bottom planar base 44 is positioned on top of the support structure 62 with the planar base 44 supported by the horizontal section 32 of the cassette tub pin assembly 30 at a preselected tilt angle, such as 5°. The two sidewalls 48 of the wafer cassette 40 are provided with recessed slots (not shown) for holding a wafer 20 in a vertical position therein.

Also shown in FIG. 4 is a tub body 80 which is fabricated of a chemical resistant, non-particle generating material such as teflon for holding a quantity of water 82 therein. When the tub body 80 is raised up to a top position, the wafer 20 is completely submerged in water 82 such that any drying of the slurry solution on the surface of the wafer 20 can be prevented.

Figure 5:
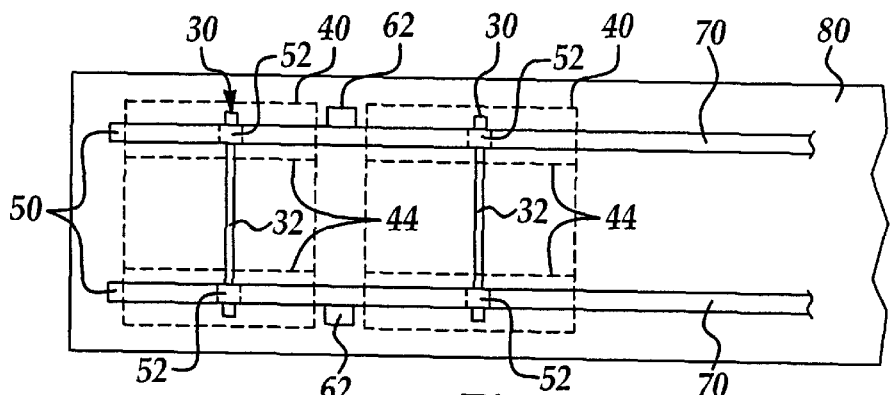
FIG. 5 is a partial, plane view of the present invention cassette tub with two wafer cassettes and two cassette tub pin assemblies installed therein.
Figure 6:
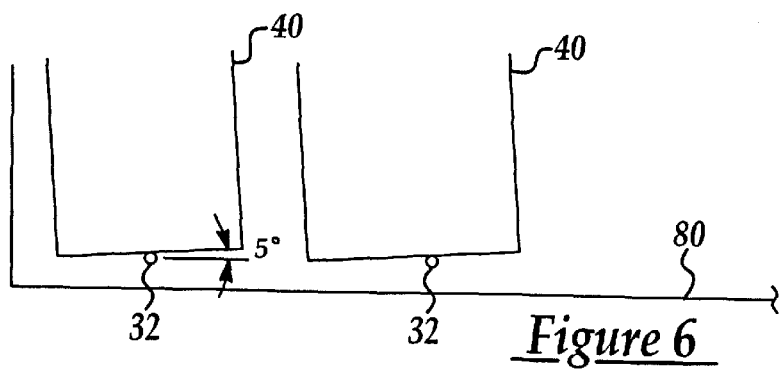
FIG. 6 is a cross-sectional view of the present invention cassette tub with two wafer cassettes installed therein at a tilted angle between about 3° and about 7°.

FIG. 5 is a partial, plane view of the tub body 80 shown in FIG. 4 with two wafer cassettes 40 positioned therein. FIG. 6 is a corresponding side view of that shown in FIG. 5. The tilt angle of the wafer cassette 40 is at a preselected value of about 5°. However, any tilt angle in the range between about 3° and 7°, and preferably between about 4° and 6° should also be adequate for the present invention novel apparatus.

The present invention novel apparatus of a cassette tub for holding at least one wafer cassette in a tilted position for accessing by a robot blade by utilizing a cassette tub pin assembly to ensure the tilt angle of the wafer cassette does not change has been amply described in the above description and in the appended drawings of FIGS. 3–6.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A cassette tub for holding at least one wafer cassette in a tilted position for accessing by a robot blade comprising:

a tub body of generally rectangular shape with an open top for holding a quantity of water therein, said tub body having two opposing longitudinal sidewalls;

a support structure affixed to a process machine onto which the tub body is situated equipped with two mounting rails along said longitudinal sidewalls each having mounting holes for receiving at least one cassette tub pin assembly;

at least one wafer cassette having a planar base portion for engaging said at least one cassette tub pin assembly such that the at least one wafer cassette is maintained at a tilted position of between about 3° and about 7° when measured from a horizontal plane; and at least one cassette tub pin assembly each having a straight section for engaging the planar base portion of a wafer cassette and two 90° bent sections each having a screw hole at a tip portion, each screw hole for engaging one of said mounting holes provided in one of the mounting rails by a screw.

2. A cassette tub for holding at least one wafer cassette in a tilted position for accessing by a robot blade according to claim 1, wherein said at least one cassette tub pin assembly is fabricated of stainless steel.

3. A cassette tub for holding at least one wafer cassette in a tilted position for accessing by a robot blade according to claim 1, wherein said tub body is fabricated of a chemical resistant, non-particle generating material.

4. A cassette tub for holding at least one wafer cassette in a tilted position for accessing by a robot blade according to claim 1, wherein said tub body is fabricated of teflon.

5. A cassette tub for holding at least one wafer cassette in a tilted position for accessing by a robot blade according to claim 1, wherein said support structure is fabricated of stainless steel.

6. A cassette tub for holding at least one wafer cassette in a tilted position for accessing by a robot blade according to claim 1, wherein said planar base portion equipped with engagement means for engaging said cassette tub pin assembly.

7. A cassette tub for holding at least one wafer cassette in a tilted position for accessing by a robot blade according to claim 1, wherein said planar base portion equipped with a recessed slot for engaging said cassette tub pin assembly.

8. A cassette tub for holding at least one wafer cassette in a tilted position for accessing by a robot blade according to claim 1, wherein said tub holds four wafer cassettes.

9. A cassette tub for holding at least one wafer cassette in a tilted position for accessing by a robot blade according to claim 1, wherein said two mounting rails are fabricated of teflon.

10. A cassette tub for holding at least one wafer cassette in a tilted position for accessing by a robot blade according to claim 1, wherein said screw used to engage said screw hole on said cassette tub pin assembly to said mounting hole on said mounting rail is fabricated of stainless steel.

* * * * *